United States Patent
Bader

(10) Patent No.: US 11,901,884 B2
(45) Date of Patent: Feb. 13, 2024

(54) METHOD FOR PROTECTING A TRANSISTOR FROM OVERLOAD AND ELECTRONIC CIRCUIT

(71) Applicant: Infineon Technologies AG, Neubiberg (DE)

(72) Inventor: Markus Bader, Merching (DE)

(73) Assignee: Infineon Technologies AG, Neubiberg (DE)

( * ) Notice: Subject to any disclaimer, the term of this patent is extended or adjusted under 35 U.S.C. 154(b) by 17 days.

(21) Appl. No.: 17/223,243

(22) Filed: Apr. 6, 2021

(65) Prior Publication Data
US 2021/0344337 A1    Nov. 4, 2021

(30) Foreign Application Priority Data

Apr. 30, 2020 (DE) .......................... 102020111875.9

(51) Int. Cl.
*H03K 17/0814* (2006.01)

(52) U.S. Cl.
CPC .................. *H03K 17/08142* (2013.01); *H03K 2217/0027* (2013.01)

(58) Field of Classification Search
CPC .. H03K 17/08; H03K 17/081; H03K 17/0814; H03K 17/08142; H03K 17/08148; H03K 17/082; H03K 17/0822; H03K 17/0828; H03K 2217/0027; G01R 1/20; G01R 1/203; G01R 1/36; G01R 19/00; G01R 19/16533; G01R 19/16538; H02H 9/02; H02H 9/025
USPC ........ 323/222–226, 271–278, 282–285, 351; 361/54, 57, 78, 79, 86, 87, 93.1–101
See application file for complete search history.

(56) References Cited

U.S. PATENT DOCUMENTS

| | | | | |
|---|---|---|---|---|
| 6,392,392 B1* | 5/2002 | Nakahara | ........... | H03K 17/0822 324/762.02 |
| 2014/0334051 A1* | 11/2014 | Yagyu | ................ | G01R 19/0092 361/93.1 |
| 2016/0087626 A1* | 3/2016 | Kaeriyama | ......... | H02M 7/5387 327/109 |
| 2017/0163255 A1* | 6/2017 | Graf | .................... | H03K 17/0822 |
| 2018/0115153 A1* | 4/2018 | Baik | ...................... | H02H 7/005 |

FOREIGN PATENT DOCUMENTS

| DE | 19837167 A1 | 11/1999 |
|---|---|---|
| DE | 102007046488 A1 | 4/2009 |

OTHER PUBLICATIONS

Office Action, in the German language, from counterpart German Application No. 102020111875.9, dated Oct. 15, 2020, 8 pp.

\* cited by examiner

*Primary Examiner* — Thienvu V Tran
*Assistant Examiner* — Carlos O Rivera-Perez
(74) *Attorney, Agent, or Firm* — Shumaker & Sieffert, P.A.

(57) ABSTRACT

A method is described. The method comprises determining a first measurement signal (CS1) which depends on a first load current (I1) through a first transistor (Q1) which is connected in series to a load (Z); determining a second measurement signal (CS2) which depends on a second load current (I2) through a second transistor (Q2) which is connected in series to the load (Z); and comparing the first measurement signal (CS1) and the second measurement signal (CS2), in order to detect the presence of an error.

23 Claims, 9 Drawing Sheets

METHOD FOR PROTECTING A TRANSISTOR FROM OVERLOAD AND ELECTRONIC CIRCUIT

This Application claims priority to German Application Number 102020111875.9, filed on Apr. 30, 2020, the entire content of which is incorporated herein by reference.

This description relates to a method for protecting a transistor from overload and an electronic circuit with a transistor.

Transistors are commonly used for controlling different types of electronic or electrical loads, such as motors, lamps, magnetic valves, for example, to mention only a few. For this purpose, it is usually connected in series to the load and a supply voltage is applied via a series connection with the load and with it, so that a current can flow through the load when it is switched on.

During operation, transistors are to be protected against an overload as a result of an excessive load current, otherwise there is the danger that the transistor will be damaged or destroyed. An excessive load current can occur, for example, if a short circuit occurs in the load or parallel to the load. A low impedance short circuit, i.e. a short circuit in which a resistance in the short circuit path is in the range of an on-state resistance of the switch, or is below it, can be detected comparatively easily. A low impedance short circuit of this type causes a significant increase of a voltage across the transistor, so that a short circuit of this type can be detected by monitoring the voltage across the transistor, for example.

A high impedance short circuit is more difficult to detect, i.e. a short circuit in which a current flows via the short circuit path, which current only increases the load current through the transistor to the extent that the load current is still within a permissible range. There is therefore a demand for an improved method for detecting a short circuit in a load which is connected in series to a transistor.

One example relates to a method. The method comprises determining a first measurement signal which depends on a first load current through a first transistor which is connected in series to a load, and determining a second measurement signal which depends on a second load current through a second transistor which is connected in series to the load. The method also comprises comparing the first measurement signal and the second measurement signal, in order to detect the presence of an error.

Examples are explained hereinafter using drawings. The drawings serve to illustrate specific principles, so that only aspects which are necessary for understanding these principles are represented. The drawings are not to scale.

In the drawings, the same reference numbers refer to the same features.

The features of the different exemplary embodiments described herein can of course be combined with one another, unless explicitly specified otherwise.

Figure 1:
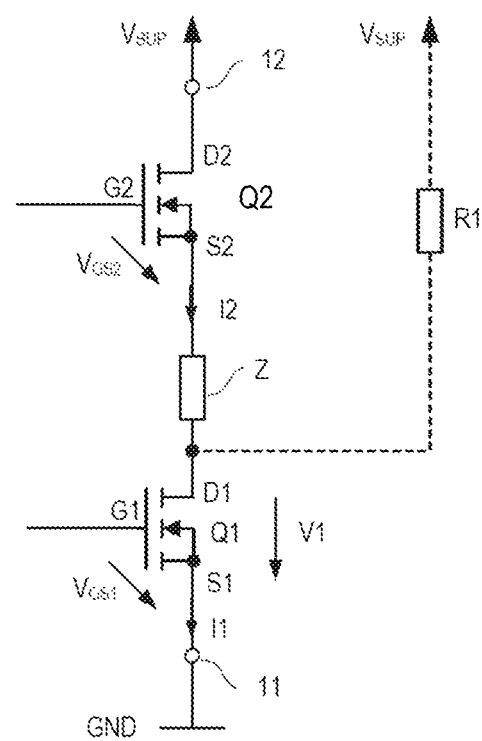
FIG. 1 shows an example of an electronic circuit with a first transistor and a second transistor which are each connected in series to a load.

FIG. 1 shows an example of an electronic circuit with a first transistor Q1 and a second transistor Q2 which are each connected in series to a load Z and in series to one another. More precisely, load paths of the two transistors Q1, Q2 are connected in series to one another and in series to the load Z. In the example represented in FIG. 1, the two transistors Q1, Q2 are realized as a MOSFET. In this case, a load path of the first transistor Q1 is formed by an internal current path of the first transistor Q1 between a drain connection D1 and a source connection S1 and a load path of the second transistor Q2 is formed by an internal current path of the second transistor Q2 between a drain connection D2 and a source connection S2. The transistors Q1, Q2 can each be switched on or off by a control signal $V_{GS2}$, $V_{GS2}$ received at a control input. Control inputs of the two MOSFETs Q1, Q2 are formed by a gate terminal G1, G2 and the respective source connection S1, S2. In this case, the control signal $V_{GS1}$, $V_{GS2}$ is a voltage between the respective gate terminal G1, G2 and the respective source connection S1, S2.

The control of the first and second transistor Q1, Q2, i.e. switching the first and second transistor Q1, Q2 on and off, can take place by way of any control circuit (not represented in FIG. 1) which is suitable for generating the control signals or control voltages $V_{GS1}$, $V_{GS2}$ for controlling the transistors Q1, Q2.

In the example represented in FIG. 1, the first transistor Q1 and the second transistor Q2 are each realized as a MOSFET, in particular as an n-type enhancement MOSFET. However, this is merely one example. The first transistor Q1 and the second transistor Q2 can of course also be realized as any other type of transistor, such as a p-type enhancement MOSFET, as a p-type or n-type depletion MOSFET, as a JFET (junction field-effect transistor), as a junction transistor (bipolar junction transistor, BJT), as an HEMT (high electron-mobility transistor), or the like, for example. The two transistors Q1, Q2 can be transistors of the same transistor type or can be transistors of different transistor types.

In the example represented in FIG. 1, the load path of the first transistor Q1 is connected between the load Z and a first supply connection 11 and the load path of the second transistor Q2 is connected between the load Z and a second supply connection 12. During operation of the electronic circuit, the first supply connection 1 is at a ground potential GND, for example, and the second supply connection 12 is at a supply potential $V_{SUP}$, for example, so that a supply voltage is applied via the series connection with the two transistors Q1, Q2 and the load Z.

The load Z can be any electrical load, such as a motor, a magnetic valve, a lamp or the like, for example. The load Z has a current flowing through it if both transistors Q1, Q2 are switched on. During normal operation of the circuit, i.e. if there is no error present, the supply voltage which is applied between the supply connections 11, 12 is substantially applied across the load Z if both transistors Q1, Q2 are switched on.

The load Z can be controlled in a pulse width modulated (PWM) manner, for example. In this case, it is possible to switch both transistors Q1, Q2 on and off in a pulse width modulated manner. Moreover, it is also possible to permanently switch on one of the two transistors, such as the first transistor Q1, for example, for a specified period and to switch the further transistor, such as the second transistor Q2, for example, on and off in a pulse width modulated manner within the specified period.

During operation of the circuit represented in FIG. 1, different types of errors may occur. One possible error is a short circuit which causes a circuit node between the load Z and the load path of the first transistor Q1 to be coupled to the supply potential $V_{SUP}$ via a short circuit current path, bypassing the load Z and the second transistor Q2. A short circuit of this type is represented with dashed lines in FIG. 1, wherein R1 refers to a resistance in the short circuit path.

A distinction is made hereinafter between a low impedance short circuit and a high impedance short circuit, which can also be referred to as a smooth short circuit. A low impedance short circuit is a short circuit in which the resistance R1 of the short circuit current path is in the range of an on-state resistance Rom of the first transistor Q1. The "on-state resistance $R_{ON1}$" of the first transistor Q1 is the ohmic resistance of the load path of the first transistor Q1 in the switched-on state. In a low impedance short circuit, a load path voltage V1 increases significantly via the load path of the first transistor Q1 when the first transistor Q1 is switched on. A low impedance short circuit of this type can, for example, be detected by monitoring the load path voltage V1, wherein a low impedance short circuit of this type can be assumed if the load path voltage V1 exceeds a specific voltage threshold. The load path voltage V1 of the first transistor Q1 is subsequently also referred to as a first load path voltage.

A high impedance short circuit (smooth short circuit) is a short circuit in which the resistance R1 in the short circuit current path is small enough that a short circuit current flows via the short circuit current path, and thus via the first transistor Q1, but at the same time is high enough that a load current I1 which flows through the first transistor Q1 does not exceed a permissible current value. The first load path voltage V1 (which substantially corresponds to the current value of the load current I1 multiplied by the on-state resistance $R_{ON1}$) thus does not reach a specific voltage threshold upon reaching which an error can be assumed. Although a smooth short circuit may not or may not immediately damage the first transistor Q1, it is nevertheless desirable to also be able to identify a short circuit of this type.

Figure 2:
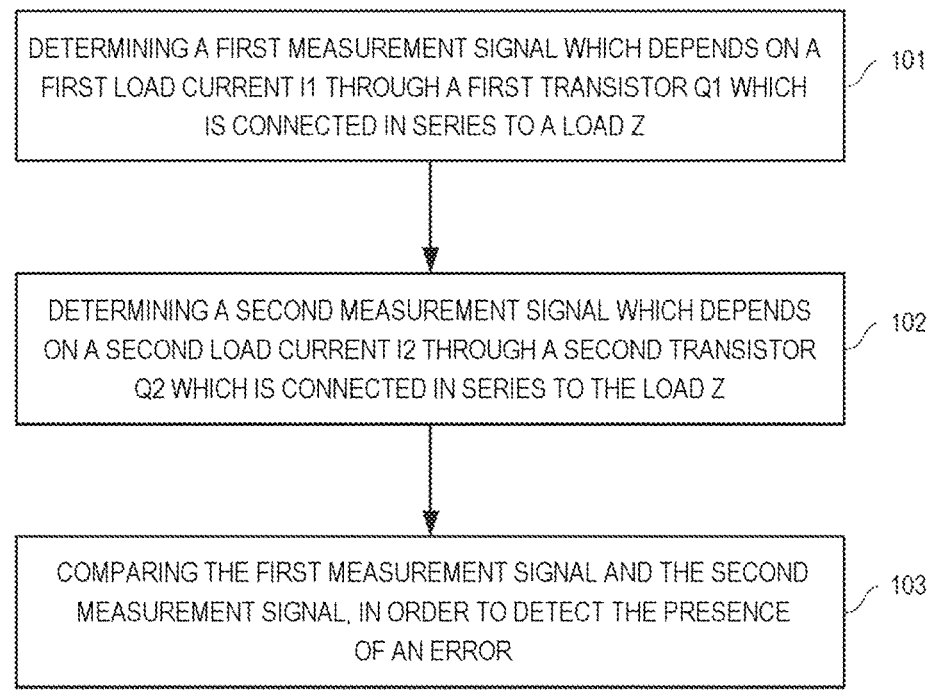
FIG. 2 shows a flow diagram of a method for detecting an error in an electronic circuit of the type represented in figure, wherein the method comprises determining a first and a second measurement signal and comparing the measurement signals.

FIG. 2 illustrates an example of a method which is suitable for detecting, in a circuit of the type represented in FIG. 1, a short circuit and in particular also a smooth short circuit. This method comprises determining a first measurement signal which depends on the first load current I1 through the first transistor Q1 (101), determining a second measurement signal which depends on a second load current I2 through the second transistor Q2 (102), and comparing the first measurement signal and the second measurement signal, in order to detect the presence of an error. According to one example, the presence of an error, in particular a short circuit, is assumed if one of the first and second measurement signal deviates from the other of the first and second measurement signal by more than a predetermined value, i.e. if one of the first and second load currents I1, I2 represented by the measurement signals deviates from the other of the load currents I1, I2 represented by the measurement signals by more than a predetermined value.

The "predetermined value" can in this case be an absolute value or a relative value. In the latter case, an error is identified if one of the measurement signals is more than c times the other of the measurement signals, for example, wherein c is a predetermined value where c>1.

In the case of no error, the first and second load current I1, I2 are the same size in the circuit according to FIG. 1 when the first transistor Q1 is switched on and the second transistor Q2 is switched on. The second load current I2 which flows into the load via the second transistor Q2 therefore corresponds to the first load current I1 which flows through the first transistor Q1. In the case of an error, i.e. in the presence of a short circuit of the type represented in FIG. 1, the first load current I1 is higher than the second load current by a specific value, wherein the specific value corresponds to a short circuit current through the short circuit current path. In the case of the method represented by means of FIG. 2, by comparing the first and second measurement signals which represent the first and second load currents I1, I2, the presence of a short circuit can therefore be detected even if only a small current flows via the short circuit current path compared to the second load current I2.

Figure 3:
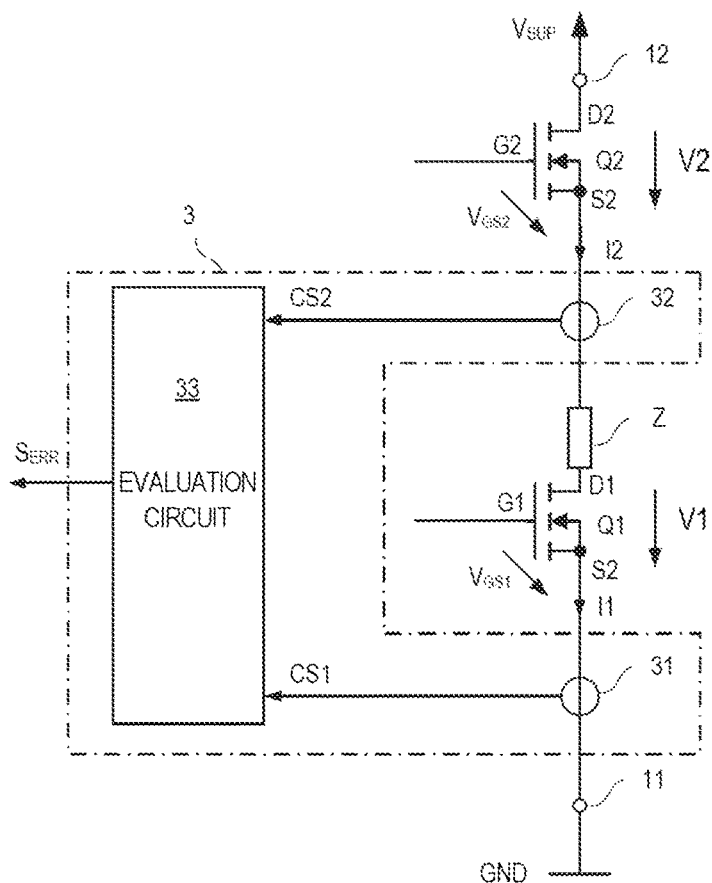
FIG. 3 shows an example of an electronic circuit with a first and second transistor and an error detection circuit.

FIG. 3 illustrates an example of an electronic circuit of the type represented in FIG. 1, which includes an error detection circuit 3, wherein the error detection circuit 3 is designed to carry out the method explained by means of FIG. 2. The error detection circuit 3 comprises a first current senor 31 which is designed to determine a first measurement signal CS1 which depends on the first load current I1, and a second current senor 32 which is designed to determine a second measurement signal CS2 which depends on the second load current I2. According to one example, the first current senor 31 is designed to determine the first measurement signal CS1 in such a way that it is proportional to the first load current I1 and the second current senor 32 is designed to determine the second measurement signal CS2 in such a way that it is proportional to the second load current I2. An evaluation circuit 33 receives the first measurement signal CS1 and the second measurement signal CS2 and is designed to compare the first measurement signal CS1 with the second measurement signal CS2, in order to detect the presence of an error. According to one example, the evaluation circuit 33 is designed to specify an error signal $S_{ERR}$ which indicates the presence of an error. According to one example, the error signal $S_{ERR}$ is a two-valued signal which assumes a first signal level in the presence of an error and assumes a second signal level in the absence of an error. The first signal level, which represents an error, is also referred to as an error level hereinafter.

The first and second current sensor 31, 32 can be any type of current sensors which are suitable for detecting the respective load current I1, I2 and for generating the respective measurement signal CS1, CS2. The two current sensors 31, 32 can be realized in the same manner or can be realized in different manners. Suitable types of current sensors for realizing the first and second current sensor 31, 32 comprise, but are not limited to: inductive current sensors, Hall sensors, shunt sensors, or the like.

A shunt sensor comprises a shunt resistor which is connected in the current path in which the current is to be measured. In this case, the voltage across the shunt resistor is proportional to the current through the shunt resistor and the (ideally constant) resistance value of the shunt resistor. According to one example, the transistors Q1, Q2 may not only serve as electronic switches for switching the first and second load currents I1, I2, but at the same time may also serve as shunt resistors for measuring the load currents. This means that the first load current I1 can, for example, be detected by measuring a first load path voltage V1 of the first transistor Q1 in the switched-on state. When the first transistor T1 is switched on, the first load path voltage V1 is substantially proportional to the first load current I1 and to the on-state resistance $R^{ON1}$ of the first transistor Q1. Correspondingly, in the switched-on state of the second transistor Q2, the second load path voltage V2 of the second transistor Q2 is substantially proportional to the second load current I2 and to an on-state resistance $R_{ON2}$ of the second transistor Q2. The first and second transistor Q1, Q2 can therefore be part of the respective current sensor 31, 32 at the same time.

Figure 4:
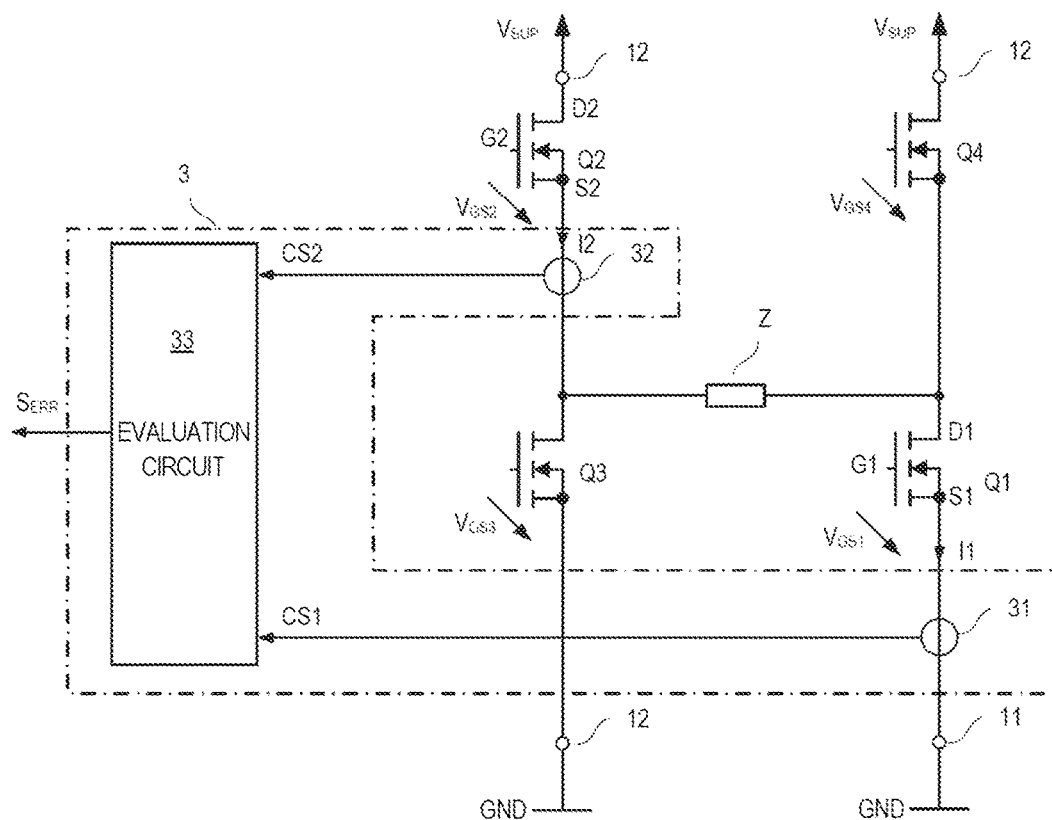
FIG. 4 illustrates the use of a circuit of the type shown in FIG. 3 in an H-bridge.

As represented in FIG. 4, the first transistor Q1 and the second transistor Q2 can be part of an H-bridge which, in addition to the first transistor Q1 and the second transistor Q2, has a third transistor Q3 and a fourth transistor Q4. In the example represented in FIG. 4, the third transistor Q3 and the fourth transistor Q4 are also realized as a MOSFET, in particular as an n-type enhancement MOSFET. However, this is merely one example. The third transistor Q3 and the fourth transistor Q4 can each also be realized as any other type of transistor.

In the circuit represented in FIG. 4, the second transistor Q2 and the third transistor Q3 form a first half bridge. In this case, the load path of the second transistor Q2 and a load path of the third transistor Q3 are connected in series between the first and second supply nodes 11, 12, wherein the second transistor Q2 forms a high-side transistor of this half bridge and wherein the third transistor Q3 forms the low-side transistor of this half bridge. The first transistor Q1 forms a second half bridge with the fourth transistor Q4. In this case, the load path of the first transistor Q1 and a load path of the fourth transistor Q4 are connected in series between the first supply node 11 and the second supply node 12, wherein the first transistor Q1 forms the low-side transistor of this half bridge and the fourth transistor Q4 forms the high-side transistor of this half bridge. The "high-side transistor" of the respective half bridge is the transistor which is directly connected to the second supply node 12 and the "low-side transistor" of the respective half bridge is the transistor which is directly connected to the first supply node 11.

Each of the two half bridges has a tap which is formed by a circuit node which is common to the high-side transistor and the low-side transistor of the respective half bridge. The load Z is connected between the taps of the two half bridges. By controlling the four transistors Q1-Q4 of the H-bridge in a suitable manner, the direction of a current through the load Z and also the mean value of the current through the load Z can be set in a manner which is known. The current through the load Z flows in a first direction if the first transistor Q1 and the second transistor Q2 are switched on and the third transistor Q3 and the fourth transistor Q4 are switched off, for example. The current through the load Z flows in a direction which is opposite to the first direction if the first transistor Q1 and the second transistor Q2 are switched off and the third transistor Q3 and the fourth transistor Q4 are switched on. The first transistor Q1 and the second transistor Q2 can always be part of an H-bridge, even if the further transistors Q3, Q4 of this H-bridge are not represented in the other figures.

Figure 5:
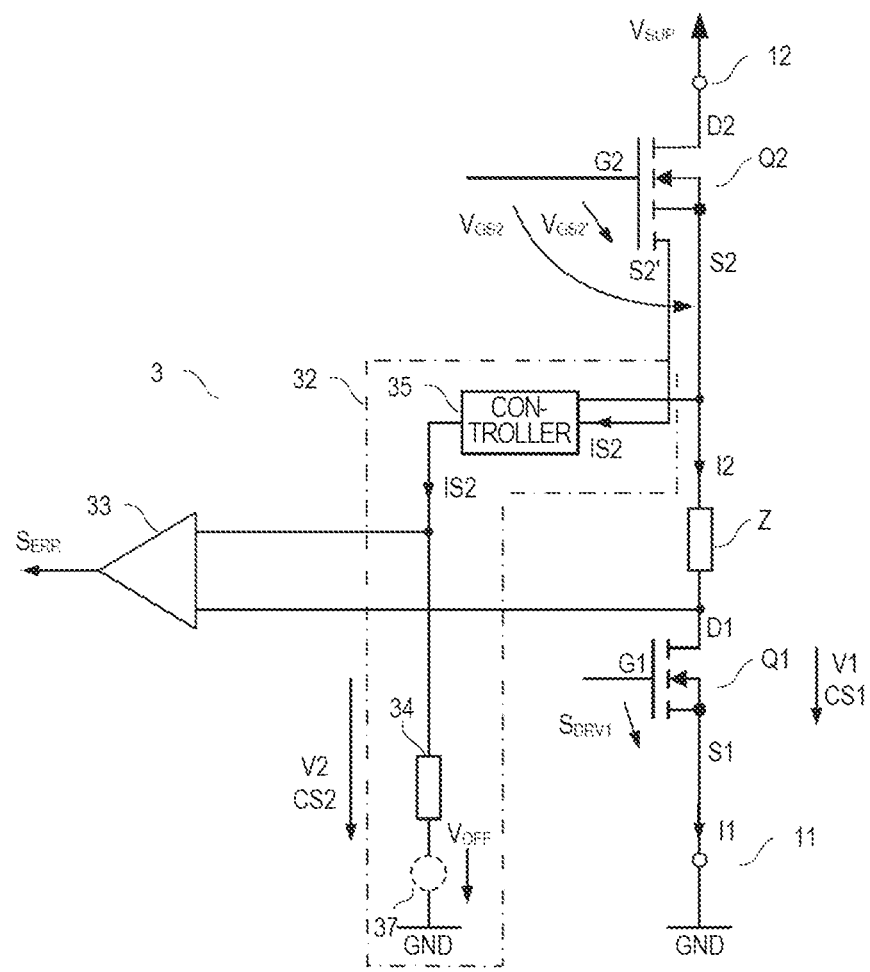
FIG. 5 shows one possible realization of the error detection circuit in further detail.

FIG. 5 shows an example of the error detection circuit 3 in further detail. In this error detection circuit 3, the first measurement signal CS1 is the load path voltage V1 of the first transistor Q1, the first transistor Q1 therefore acts as a shunt resistor in this error detection circuit, so that the measurement signal CS1 is related to the first load current I1 via the on-state resistance $R_{ON1}$ of the first transistor Q1, i.e.

$$CS1 = R_{ON1} \cdot I1 \quad (1),$$

wherein I1 is the first load current and $R_{ON1}$ is the on-state resistance of the first transistor Q1.

In the example shown in FIG. 5, the second transistor Q2 comprises a further source connection S2' in addition to the load path between the drain connection D2 and the source connection S2 and the gate terminal G2. In the case of this transistor Q2, the source connection S2 can also be referred to as a charge current output and the further source connection ST can also be referred to as a measurement current output. In this example, the second current senor 32 comprises a controller 35 which is connected to the source connection S2 and the further source connection S2' of the second transistor Q2 and which is designed to control an electrical potential at the further source connection S2' in such a way that a current IS2 which is received from the further source connection S2', which current is also referred to as a measurement current hereinafter, is substantially proportional to the second load current I2, i.e.

$$I2 = k_{ILIS} \cdot IS2 \quad (2),$$

wherein $k_{ILIS}$ refers to the current proportionality factor between the second load current I2 and the measurement current IS2. This current proportionality factor $k_{ILIS}$ depends on the design of the second transistor Q2 and is between $10^4$ (=1E4) and several $10^5$ (=1E5), for example.

The second transistor Q2 according to FIG. 5 comprises two transistors, a load transistor and a measurement transistor, wherein the load transistor and the measurement transistor possess a common drain connection D2 and a common gate terminal G2 and separate source connections S2, S2'. In this case, the load path of the load transistor runs between the drain connection D2 and the source connection S2 and the load path of the measurement transistor runs between the drain connection D2 and the further source connection (current detection connection) S2'. Correspondingly, a control input of the load transistor is formed by the gate terminal G2 and the source connection S2 and a control input of the measurement transistor is formed by the gate terminal G2 and the further source connection S2'.

According to one example, the proportionality, explained on the basis of equation (2), between the measurement current IS2 and the load current I2 is specified if the load transistor and the measurement transistor are operated at the same operating point, which is the case if the control voltage $V_{GS2}$ of the load transistor is substantially equal to a control voltage $V_{GS2}'$ of the measurement transistor, i.e. if the electrical potentials at the source connection S2 and the further source connection S2' are equal. The control voltage $V_{GS2}'$ of the measurement transistor is a voltage between the gate terminal G2 and the further source connection ST. According to one example, the controller 35 of the second current senor 32 is therefore designed to set the electrical potential at the further source connection S2' in such a way that this electrical potential corresponds to the electrical potential at the source connection S2. One example of a controller 35 of this type is represented in FIG. 6.

Figure 6:
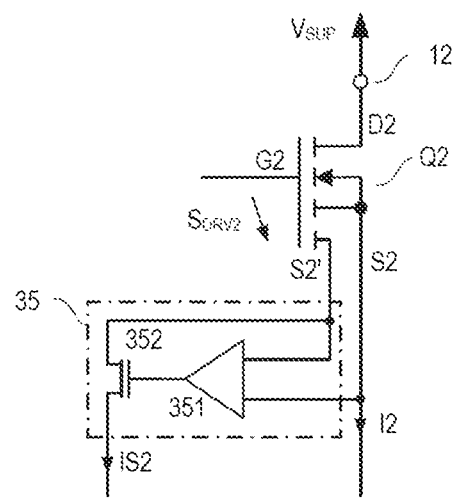
FIG. 6 shows one possible realization of a controller in the electronic circuit according to FIG. 5.

According to FIG. 6, the controller 35 comprises an operational amplifier 351 with a first input which is coupled to the source connection S2 and a second input which is coupled to the further source connection S2'. This operational amplifier 351 controls a controllable resistor 352, wherein this controllable resistor 352 is connected to the further source connection S2' and supplies the measurement current IS2. In this case, the operational amplifier 351 controls the resistance value of the controllable resistor 352 in such a way that the electrical potentials at the source connection S2 and the further source connection S2' are substantially equal. According to one example, the controllable resistor 352 is a transistor, such as a MOSFET, for example, which is controlled by the operational amplifier 351.

In the example represented in FIG. 5, the second current senor 32 also comprises a measuring resistor (shunt resistor 34) which is connected in series to the controller 35 so that the measuring resistor 34 has a measurement current IS2 flowing through it. In this case, the second measurement signal CS2 corresponds to a voltage V34 across the measuring resistor. In the example shown in FIG. 5, the following applies to this second measurement signal CS2:

$$CS2 = R34 \cdot \frac{I2}{k_{ILIS}}, \tag{3}$$

wherein R34 refers to the resistance value of the measuring resistor 34, I2 to the second load current and $k_{ILIS}$ to the current proportionality factor.

In the example shown in FIG. 5, the evaluation circuit 33 is realized as a comparator. This comparator is designed in such a way, for example, that it generates an error level of the error signal $S_{ERR}$ if the first measurement signal CS1 is greater than the second measurement signal CS2, i.e. if the following applies:

$$CS1 > CS2 \tag{4a}.$$

This is equivalent to the fact that the first load current I1 is greater than c times the second load current I2, $$I1 > c \cdot I2 \tag{4b},$$

wherein $$c = \frac{R34}{k_{ILIS}} \cdot \frac{1}{R_{ON1}}. \tag{4c}$$

As can be seen from equation (4c), the factor c, which defines from which deviation of the first load current I1 from the second load current I2 the presence of an error is detected and an error level of the error signal $S_{ERR}$ is output, can be set depending on the resistance value of the measuring resistor R34, wherein the current proportionality factor $k_{ILIS}$ and the on-state resistance $R_{ON1}$ of the first transistor Q1 are fixedly predetermined.

Via the factor c, it can therefore in particular be defined from which current level of the short circuit current an error is detected. In this example, the factor c is greater than 1 (c>1). The smaller c is, the smaller the distance of the two curves in the case of a specified second load current I2 and the lower the current level of the short circuit current from which an error is detected. In the example explained previously, the current level of the short circuit from which an error is detected depends on the instantaneous value of the second load current I2 and increases if the instantaneous value of the second load current I2 increases.

Figure 7:
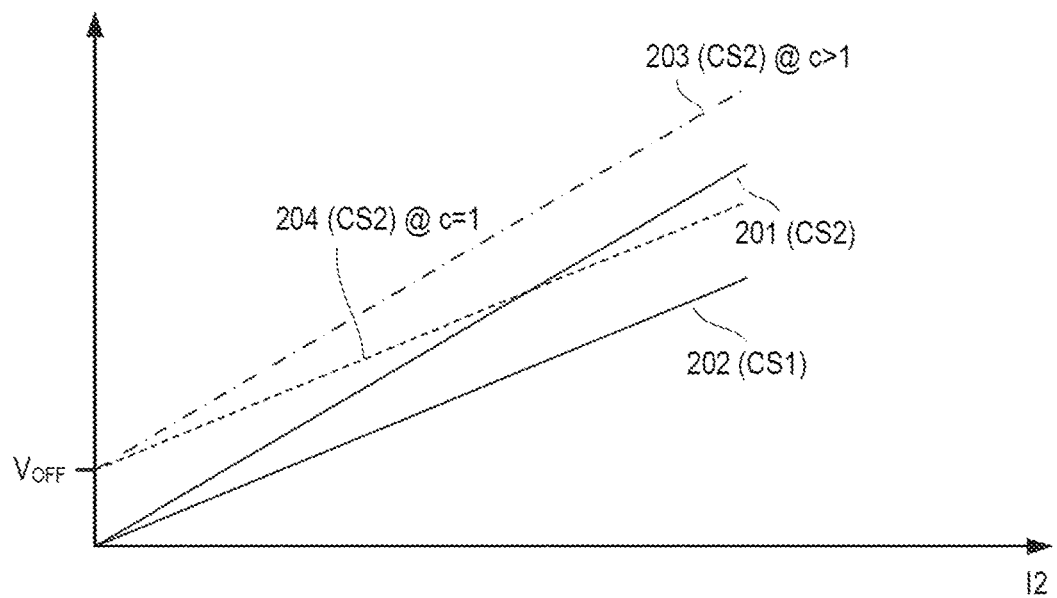
FIG. 7 illustrates the dependence of the second measurement signal on a second load current according to one example.

In FIG. 7, the curve 201 illustrates an example for the dependence of the second measurement signal CS2 on the second load current I2. The curve 202 also illustrates the first measurement signal CS1 in the case of no error, i.e. if the first load current I1 is equal to the second load current I2. In the case of no error, the first measurement signal CS1 is smaller than the second measurement signal CS2. A difference between the curve 201, which represents the second measurement signal CS2, and the curve 202, which represents the first measurement signal CS1 in the case of no error, represents a short circuit current, in the case of which the first measurement signal CS1 increases up to the value of the second measurement signal CS2, so that an error is detected.

With reference to FIG. 5, the second current senor 32 optionally comprises an offset voltage source 37 which generates an offset voltage $V_{OFF}$ and which is connected in series to the shunt resistor 34. In this case, the second measurement signal CS2 is specified by $$CS2 = R34 \cdot \frac{I2}{k_{ILIS}} + V_{OFF}. \tag{5}$$

The course of this second measurement signal CS2 depending on the second load current I2 is represented in FIG. 7 by means of the dash-dotted curve 203. An error is detected in this case if the following applies to the first load current I1:

$$I1 > \frac{1}{R_{ON1}} \cdot \left(\frac{R34}{k_{ILIS}} \cdot I2 + V_{OFF}\right), \tag{6a}$$

which is equivalent to $$I1 > c \cdot I2 + \frac{V_{OFF}}{R_{ON1}}. \tag{6b}$$

In the presence of an offset voltage source, the factor c explained previously can also be set so that it is equal to 1 (c=1). The curve 204 which is represented with dashed lines in FIG. 7 represents the course of the second measurement signal CS2 depending on the second load current in this case. Irrespective of the instantaneous value of the second load current I2, an error is always detected in this case if the first load current I1 exceeds the second load current I2 by $V_{OFF}/R_{ON1}$, therefore if the current level of the short circuit current is $V_{OFF}/R_{ON1}$.

Figure 8:
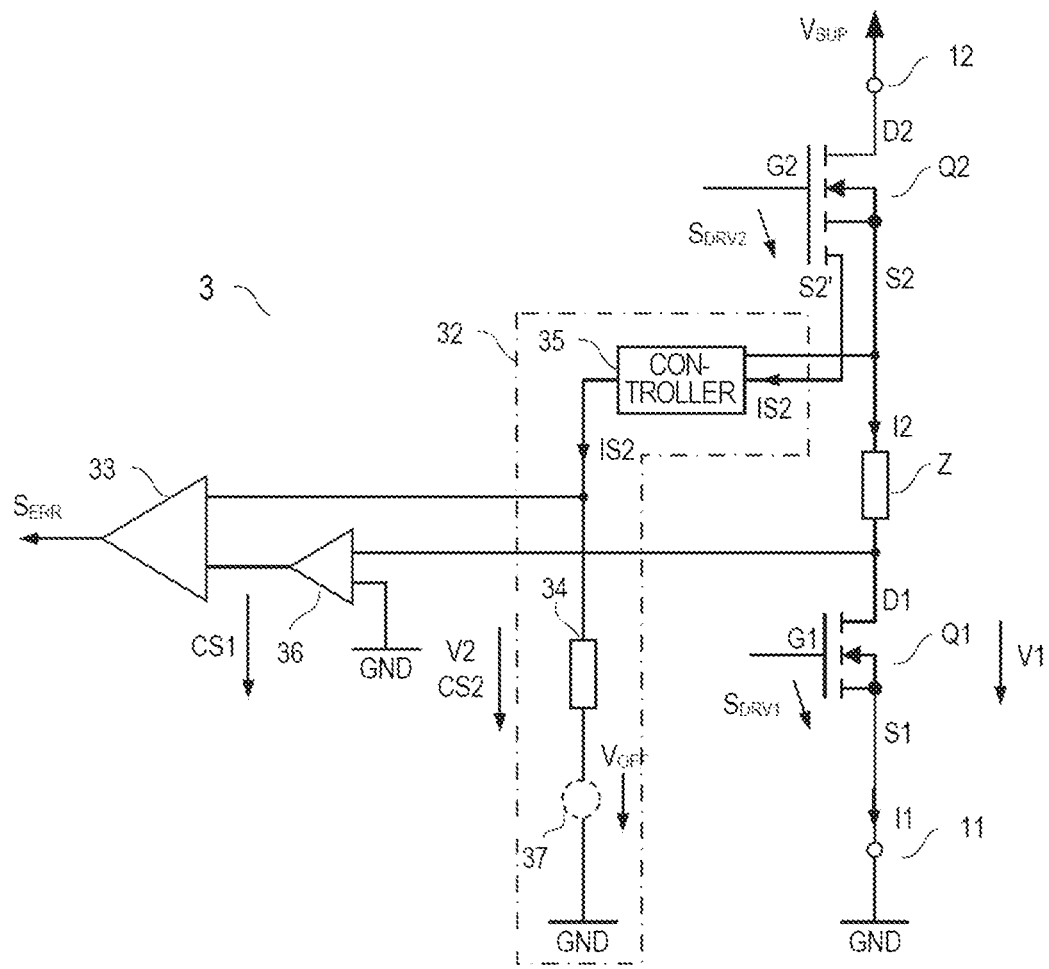
FIG. 8 shows a modification of the electronic circuit according to FIG. 5.

FIG. 8 shows a modification of the error detection circuit represented in FIG. 3. The error detection circuit 3 represented in FIG. 8 differs from the error detection circuit 3 represented in FIG. 6 by the fact that the first load path voltage V1 is not directly used as a first measurement signal CS1, but rather that this first load path voltage V1 is amplified by means of an amplifier 36, so that the following applies to the first measurement signal CS1 in this case:

$$CS1 = I1 \cdot R_{ON1} \cdot g36 \tag{7},$$

wherein g36 refers to an amplification of the amplifier 36. In this case, the following applies to the factor c explained previously, which (at least partially) defines the deviation of the first load current I1 from the second load current I2 from which an error is detected:

$$c = \frac{R34}{k_{ILIS}} \cdot \frac{1}{R_{ON1}} \cdot \frac{1}{g36}. \tag{8}$$

Figure 9:
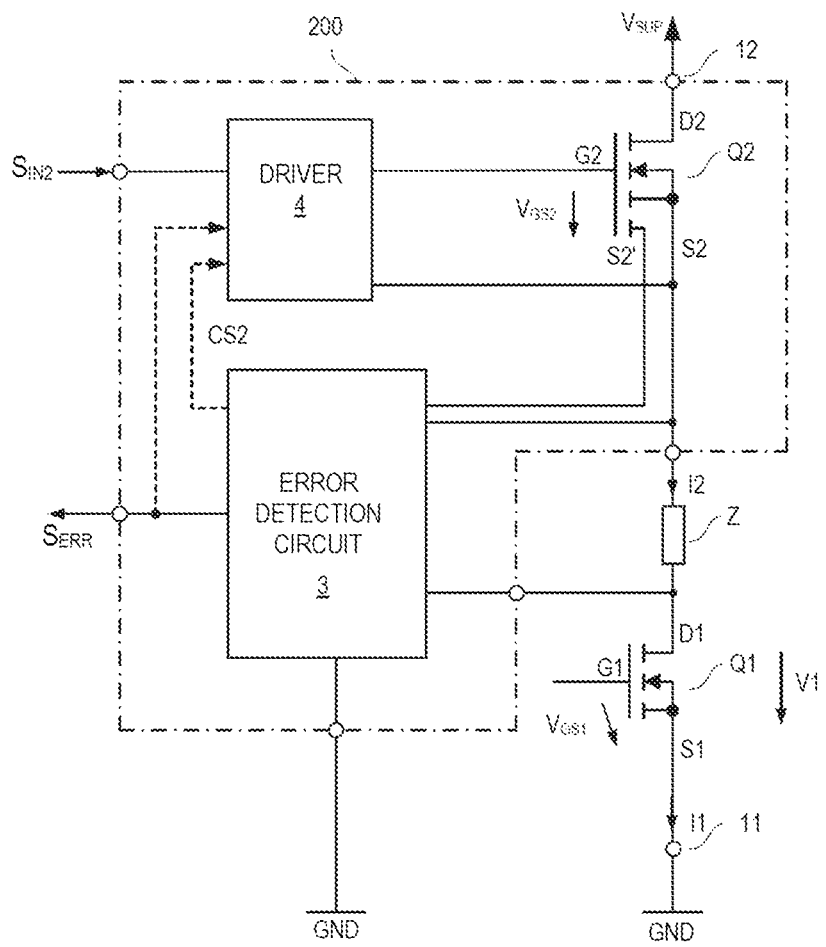
FIG. 9 illustrates an example of an electronic circuit which further includes a driver for the second transistor.

FIG. 9 shows an example of a circuit which, in addition to the first transistor Q1, the second transistor Q2 and the error detection circuit 3, includes a driver 4 for the second transistor Q2. This driver 4 is designed to receive a control signal $S_{IN2}$ and to generate the control voltage $V_{GS2}$ for the second transistor Q2 depending on the control signal $S_{IN2}$ in such a way, for example, that the driver 4 switches on the second transistor Q2 if the control signal $S_{IN2}$ has an on level, and switches off the second transistor Q2 if the control signal $S_{IN2}$ has an off level.

According to one example, provision is made to switch off at least the second transistor Q2 if an error is detected. In the circuit represented in FIG. 8, this can be achieved by the driver 4 receiving the error signal $S_{ERR}$ and being designed to switch off the second transistor Q2 irrespective of the signal level of the input signal $S_{IN2}$ if the error signal $S_{ERR}$ has an error level.

The input signal $S_{IN2}$ of the driver 4 can be generated by a central control circuit (not represented in FIG. 9), such as a microcontroller, for example. Alternatively or additionally to the fact that the driver 4 receives the error signal $S_{ERR}$, the central control circuit can receive the error signal $S_{ERR}$ and generate an off level of the control signal $S_{IN2}$, in order to switch off the second transistor Q2 if an error level of the error signal $S_{ERR}$ occurs.

According to one example, the driver 4 contains a protective circuit which is designed to monitor the second load current I2 and to protect the second transistor Q2 from an overload. According to one example, this comprises that the driver 4 switches off the second transistor Q2 if the load current I2 exceeds a predetermined current threshold and/or that the driver 4 switches off the second transistor Q2 if the load current I2 is above a predetermined second current threshold for a predetermined time duration. According to one example, the driver 4 receives the second measurement signal CS2 for monitoring the second load current I2.

Figure 10:
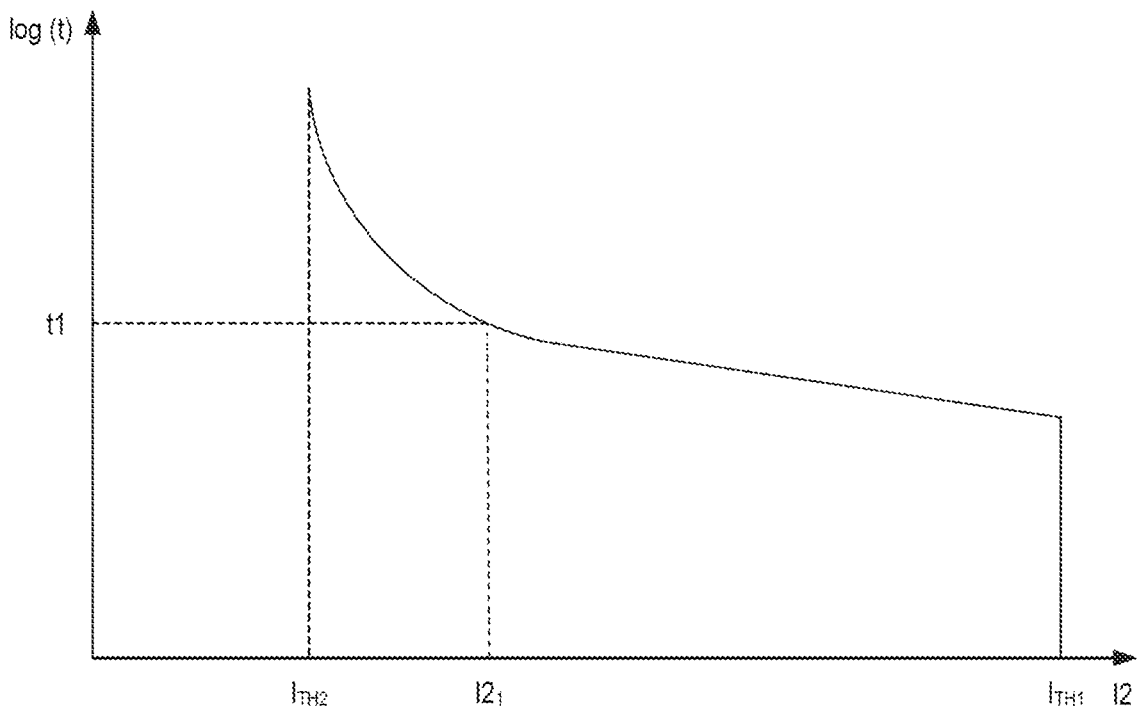
FIG. 10 illustrates a safe operating area of the second transistor and a fuse characteristic curve which is realized by the driver of the second transistor.

According to one example, a fuse characteristic curve can be implemented in the driver 4, as represented in FIG. 10 by way of example, and the driver 4 can be designed to switch off the second transistor Q2 in accordance with this fuse characteristic curve. The fuse characteristic curve represented in FIG. 10 illustrates the permissible second load current I2 through the second transistor Q2 and the time duration for which the respective load current may flow before the driver 4 switches off the second transistor Q2 in accordance with the fuse characteristic curve. A safe operating area (SOA) of the second transistor Q2 is an area which, in the diagram represented in FIG. 9, is located to the left or below the characteristic curve. According to this characteristic curve, the second transistor Q2 is immediately switched off if the second load current I2 becomes greater than the first threshold Inn. Switching off in accordance with the fuse characteristic curve does not take place if the second load current I2 is below a second current threshold Inn which is smaller than the first current threshold $I_{TH1}$. Switching off the second transistor Q2 in a time-dependent manner takes place if the load current is greater than the second current threshold $I_{TH2}$ but smaller than the first current threshold $I_{TH1}$, wherein the greater the load current I2, the smaller the time duration t until the second transistor Q2 is switched off. Switching off the second transistor Q2 in accordance with one of the methods explained previously and in particular in accordance with a fuse characteristic curve according to FIG. 10 protects not only the second transistor Q2 but also protects the first transistor Q1 during normal operation of the circuit, i.e. if there is no short circuit present. Drivers which have the ability to implement a fuse characteristic curve according to FIG. 10 are known in principle, such that no further explanations are necessary in this respect.

According to one example, the second transistor Q2, the error detection circuit 3 and the driver 4 are realized in a common integrated crcuit 200 which is represented schematically in FIG. 9 with dash-dotted lines. The first transistor Q1 can be realized as an external transistor, i.e. as a transistor which is not part of the integrated circuit 200.

It should also be noted that the error detection circuit 3 also has the ability to detect the short circuit explained at the outset if the second transistor Q2 is switched off, wherein a switching-off of this type can take place as a result of an overload or may be intentional within the context of a PWM operation. The error detection circuit 3 always compares the second load current I2, which is zero when the second transistor Q2 is switched off, with the first load current I1 and detects an error, for example, if the first load current I1 exceeds the second load current I2 by a predetermined amount.

Figure 11:
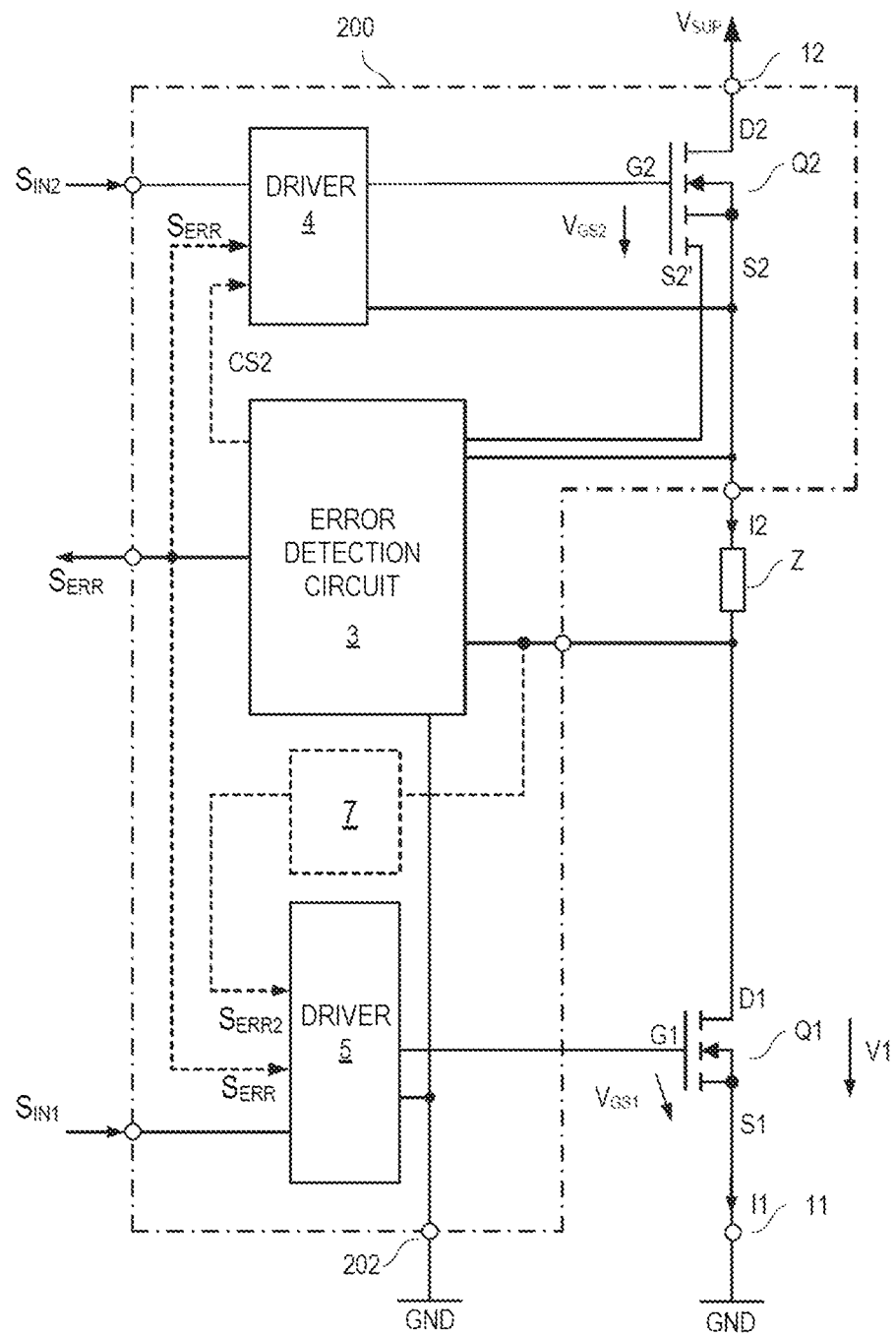
FIG. 11 shows a modification of the electronic circuit according to FIG. 9.

Referring to FIG. 11, the electronic circuit can comprise, in addition to the driver 4 for controlling the second transistor Q2, a further driver 5 which is designed to control the first transistor Q1. This driver 5 can be integrated in the same integrated crcuit 200 as the error detection circuit 3 and the driver 4 of the second transistor Q2 (as represented schematically in FIG. 11), however it can also be realized as an external driver outside this integrated circuit.

The further driver 5 is designed to receive a control signal $S_{IN1}$ for the first transistor Q1 and to generate the control voltage $V_{GS1}$ for the first transistor Q1 depending on this control signal $S_{IN1}$. This driver 5 is designed in such a way, for example, that it switches on the first transistor Q1 if the control signal $S_{IN1}$ has an on level and switches off the first transistor Q1 if the control signal $S_{IN1}$ has an off level. According to one example, the driver 5 also receives the error signal $S_{ERR}$ and is designed to switch off the transistor Q1 irrespective of the control signal $S_{IN1}$ if the error signal $S_{ERR}$ has an error level.

In principle, according to one example provision is made to switch off at least one of the two transistors Q1, Q2 when an error is detected by the error detection circuit 3. According to one example, at least the first transistor Q1 is switched off when an error is detected by the error detection circuit 3, i.e. when a short circuit is detected which additionally loads the first transistor Q1. According to one example, both transistors Q1, Q2 are switched off when an error is detected by the error detection circuit 3.

During normal operation of the circuit represented in FIG. 11, the first and second transistor Q1, Q2 are switched on and off depending on the control signal $S_{IN1}$, $S_{IN2}$ which is supplied to the respective driver 4, 5. These control signals $S_{IN1}$, $S_{IN2}$ can be generated by a conventional control circuit, such as a microcontroller, for example. In the case of an error, at least one of the two transistors Q1, Q2 is switched off irrespective of the respective control signal $S_{IN1}$, $S_{IN2}$ by the respective driver 4, 5 which receives the error signal $S_{ERR}$ from the error detection circuit 3 for this purpose.

Figure 12:
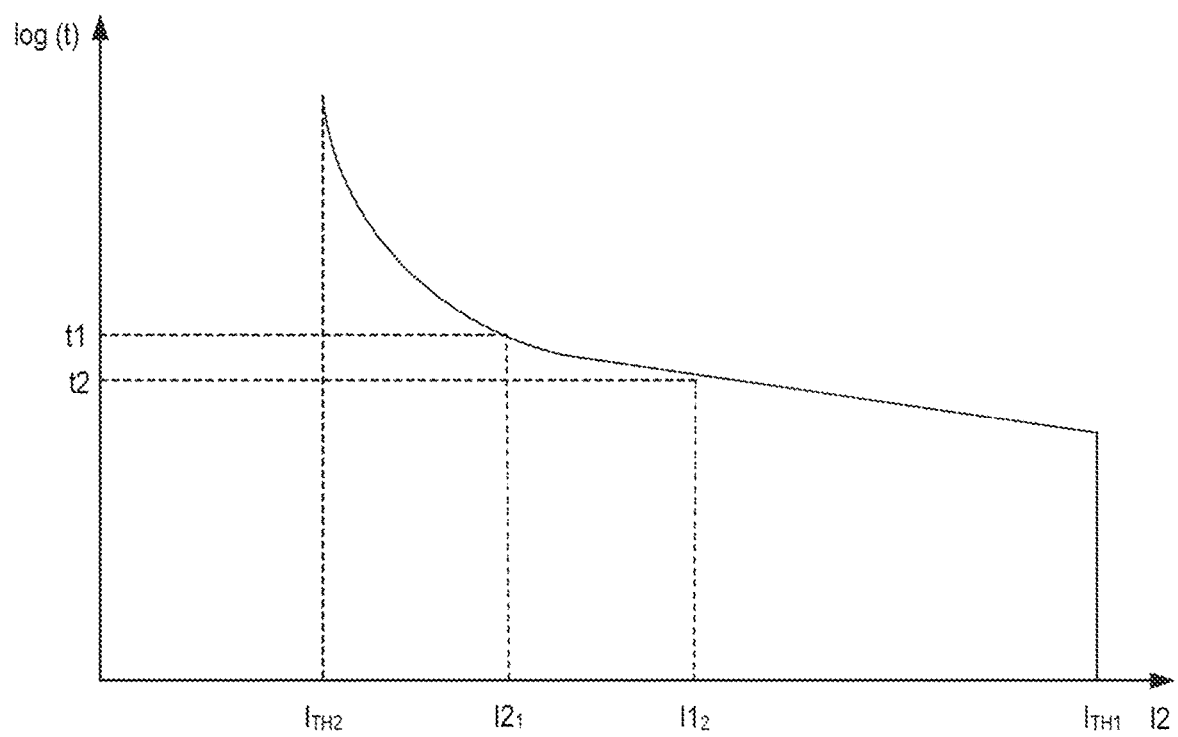
FIG. 12 illustrates a safe operating area of the first transistor.

With regard to its safe operating area (SOA), the first transistor Q1 can be realized in the same manner as the second transistor Q2. This is represented in FIG. 12, which illustrates the safe operating area of the first transistor Q1. A safe operating area of the first transistor Q1 is an area which, in the diagram represented in FIG. 12, is located to the left or below the characteristic curve which is represented there. According to this characteristic curve, the first load current I1 should be immediately interrupted by the first transistor Q1 if the first load current I1 reaches the first threshold $I_{TH1}$ and should be interrupted in a time-dependent manner if the first load current is greater than the second current threshold $I_{TH2}$ but smaller than the first current threshold ITHi, wherein the greater the first load current I1, the smaller the time duration t until the first transistor Q1 is interrupted.

During normal operation, i.e. if there is no short circuit present, the first transistor Q1 is protected by the driver 4 of the second transistor Q2 which switches off the second transistor Q2 in accordance with the fuse characteristic curve represented in FIG. 10 and thus also interrupts the first load current I1. A corresponding protective circuit therefore does not have to be implemented in the driver 5 of the first transistor Q1.

Damage to the first transistor Q1 could take place if the second load current I2 is between the first and the second threshold $I_{TH1}$, $I_{TH2}$ but, as a result of a (smooth) short circuit, the first load current I1 is above the second load current I2, such that the first transistor Q1 should in fact be switched off earlier than the second transistor Q2, in order to keep the first transistor Q1 in a safe operating area. If the second load current I2 has a first current value $I2_1$, for example, as represented in FIG. 10, the second driver 4 would switch off the second transistor Q2 at the latest after a first time duration t1 associated with this first current value $I2_1$. If a short circuit occurs in this case, such that the first load current I1 has a second current value $I1_2$ which corresponds to the first current value $I2_1$ of the second load current I2 plus a current value $I_{SC}$ of a short circuit current, $$I1_2 = I2_1 + I_{SC} \quad (9),$$

the first transistor Q1 should be switched off at the latest after a second time duration t2 associated with this second current value $I1_2$ which is shorter than the first time duration t1. In this case, protection of the first transistor Q1 is ensured by the error detection circuit 3. According to one example, the error detection circuit 3 is designed to switch off the first transistor Q1 immediately, i.e. without deliberate delay, when an error is detected (it is nevertheless unavoidable that propagation delays may occur in the error detection circuit 3 and the driver 5).

As can be seen from the characteristic curve in FIG. 12, according to one example, the first transistor Q1 should be immediately switched off if the first load current I1 reaches the first threshold Inn. For this purpose, a further error detection circuit can be provided which compares the load path voltage V1 of the first transistor Q1 or the first measurement signal CS1 with a fixedly predetermined threshold and which causes the first transistor Q1 to be switched off if the load path voltage V1 reaches this threshold value. A further error detection circuit 7 of this type is represented with dashed lines in FIG. 11.

In the example represented in FIG. 11, the further error detection circuit 7 generates a further error signal $S_{ERR2}$ which is supplied to the driver 5 of the first transistor Q1 and which can have an error level or a normal level, for example. An error level, which indicates that the load path voltage V1 has reached or exceeded the predetermined threshold value, causes the driver 5 to switch off the first transistor Q1.

This is merely one example. According to one further example, the function of the error detection circuit 3 and the further error detection circuit 7 can be realized by an error detection circuit which generates the error signal $S_{ERR}$ explained previously in such a way that it has an error level if a short circuit is detected by comparing the two measurement signals CS1, CS2 or if an overcurrent is detected in the first transistor Q1 by comparing the load path voltage V1 with the predetermined threshold value.

Some aspects of the preceding description are explained briefly hereinafter using numbered examples.

Example 1 Method which includes: determining a first measurement signal which depends on a first load current through a first transistor which is connected in series to a load; determining a second measurement signal which depends on a second load current through a second transistor which is connected in series to the load; comparing the first measurement signal and the second measurement signal, in order to detect the presence of an error.

Example 2. Method according to Example 1, in which the presence of an error is detected if one of the first and the second measurement signal deviates from the other of the first and the second measurement signal by more than a predetermined value.

Example 3. Method according to Example 1 or 2, in which determining the first measurement signal comprises detecting a load path voltage of the first transistor.

Example 4. Method according to Example 3, in which generating the first current measurement signal includes detecting the load path voltage and amplifying the load path voltage by means of an amplifier.

Example 5. Method according to one of Examples 1 to 4, in which determining the second measurement signal comprises measuring a load path voltage of the second transistor.

Example 6. Method according to one of Examples 1 to 4, in which determining the second measurement signal comprises generating a measurement current which depends on the second load current.

Example 7. Method according to Example 6, in which the second transistor has a load current output and a measurement current output and in which the measurement current is provided by a current detection circuit which is coupled to the load current output and the measurement current output.

Example 8. Method according to Example 6 or 7, in which generating the second measurement signal includes conducting the measurement current through a measuring resistor, wherein the second measurement signal is a voltage across the measuring resistor.

Example 9. Method according to one of the preceding examples, in which the first transistor is a low-side of an H-bridge and in which the second transistor is a high-side transistor of the H-bridge.

Example 10. Method according to one of the preceding examples, which further includes: switching off at least one of the first transistor and the second transistor when an error is detected.

Example 11. Method according to one of the preceding examples, which further includes: controlling the second transistor in accordance with a fuse characteristic curve which depends on the second load current.

Example 12. Method according to one of the preceding examples, which further includes: comparing the first measurement signal with a fixedly predetermined threshold value; and switching off the first transistor if the first measurement signal reaches or exceeds the fixedly predetermined threshold value.

Example 13. Electronic circuit which includes: a first electronic switch which is designed to be connected in series to a load; a second electronic switch which is designed to be connected in series to the load; an error detection circuit which is designed to determine a first measurement signal which depends on a first load current through the first transistor, to determine a second measurement signal which depends on a second load current through the second transistor, to compare the first measurement signal and the second measurement signal, in order to detect the presence of an error.

Example 14. Electronic circuit according to Example 13, in which the error detection circuit is designed to detect an error if one of the first and the second measurement signal deviates from the other of the first and the second measurement signal by more than a predetermined value.

Example 15. Electronic circuit according to Example 13 or 14, in which the error detection circuit is designed to detect a load path voltage of the first electronic switch for determining the first measurement signal.

Example 16. Electronic circuit according to Example 15, in which the second transistor includes a load current output and a measurement current output and in which the error detection circuit includes a controller which is coupled to the load current output and the measurement current output and which is designed to generate a measurement current which depends on the second load current.

Example 17. Electronic circuit according to Example 16, in which the error detection circuit further includes a measuring resistor which is connected in series to the controller, wherein the second measurement signal is a voltage across the measuring resistor.

Example 18. Electronic circuit according to one of Examples 13 to 17, in which the error detection circuit includes an amplifier which is coupled to the load path of the first transistor and which provides the first current measurement signal.

Example 19. Electronic circuit according to one of Examples 13 to 18, in which the first switch is a low-side switch of an H-bridge and in which the second switch is a high-side switch of the H-bridge.

Example 20. Electronic circuit according to one of Examples 13 to 19, which further includes: a control circuit which is designed to switch off at least one of the first electronic switch and the second electronic switch if the presence of an error is detected by the error detection circuit.

Example 21. Electronic circuit according to one of Examples 13 to 20, in which the second electronic switch and the error detection circuit are part of a common integrated circuit, and in which the first electronic switch is arranged outside the integrated circuit.

The invention claimed is:

1. A method comprising:
comparing, by an evaluation circuit, a first measurement signal to a second measurement signal, wherein the evaluation circuit comprises a measuring resistor;
wherein the first measurement signal is a drain-source voltage of a first transistor connected in series to a load,
wherein the first transistor conducts a first load current, and the first measurement signal comprises an indication of an amount of the first load current,
wherein the second measurement signal comprises a drain-source voltage of a second transistor which is connected in series to the load,
wherein the second transistor conducts a second load current, and the second measurement signal comprises an indication of an amount of the second load current;
based on the comparison, determining whether the first measurement signal deviates from the second measurement signal by more than a threshold value, wherein the threshold value defines the amount of the second load current multiplied by a constant, wherein selecting a value for the measuring resistor sets the value for the constant; and
in response to determining that the first measurement signal deviates from the second measurement signal by more than the threshold value, detecting the presence of an error.

2. The method according to claim 1,
wherein the second transistor comprises a first source connection and a second source connection,
wherein the second source connection is connected in series to the load, and wherein determining the second measurement signal comprises determining the second measurement signal based on a current though the first source connection and a proportionality factor.

3. The method according to claim 2,
wherein the current through the first source connection is a measurement current, which depends on the second load current and the proportionality factor.

4. The method according to claim 3,
wherein the evaluation circuit connects to the first source connection and
wherein the evaluation circuit is further connected to the drain-source voltage of the first transistor.

5. The method according to claim 3,
wherein determining the second measurement signal includes conducting the measurement current through the measuring resistor, wherein the second measurement signal comprises a voltage across the measuring resistor.

6. The method according to claim 5, wherein the threshold value is a fixed predetermined threshold value,
wherein the threshold value depends on both the on-state resistance, $R_{DS-ON}$, of the first transistor and a resistance value of the measuring resistor;
the method further comprising switching off the first transistor if the first measurement signal reaches or exceeds the fixed predetermined threshold value.

7. The method according to claim 1,
wherein an offset voltage is connected in series to the measuring resistor, and
wherein the threshold value further depends on a value for the offset voltage.

8. The method according to claim 1,
wherein determining the first measurement signal comprises detecting a load path voltage of the first transistor, and
wherein generating the first measurement signal includes detecting the load path voltage and amplifying the load path voltage using an amplifier.

9. The method according to claim 1,
wherein determining the second measurement signal comprises measuring a load path voltage of the second transistor.

10. The method according to claim 1,
wherein the first transistor comprises a low-side of an H-bridge, and
wherein the second transistor comprises a high-side transistor of the H-bridge.

11. The method according to claim 1, the method further comprising:
in response to detecting the presence of the error, switching off at least one of the first transistor and the second transistor.

12. The method according to claim 1, the method further comprising:
controlling the second transistor in accordance with a fuse characteristic curve which depends on the second load current.

13. The method of claim 1, wherein the evaluation circuit includes a comparator, wherein the comparator receives the first measurement signal and the second measurement signal and outputs an indication of the error in response to the second measurement signal being different than the first measurement signal by more than the threshold value.

14. An electronic circuit comprising:
a first electronic switch configured to be connected in series to a load;
a second electronic switch configured to be connected in series to the load, wherein the second electronic switch includes a first source connection and a second source connection, wherein the second source connection is connected in series to the load;
an error detection circuit comprising a measuring resistor, the error detection circuit configured to:
compare a first measurement signal to a second measurement signal, and
in response to determining that the first measurement signal deviates from the second measurement signal by more than a threshold value, output an indication of an error,
wherein the first measurement signal is a drain-source voltage of the first electronic switch connected in series to the load,
wherein the first electronic switch conducts a first load current, and the first measurement signal comprises an indication of an amount of the first load current,
wherein the second measurement signal comprises a drain-source voltage of the second electronic switch,
wherein the second measurement signal comprises an indication of the amount of a second load current through the second electronic switch output by the second source connection, wherein the second source connection is connected in series to the load, and
wherein the threshold value defines the amount of the second load current multiplied by a constant, and
wherein selecting a value for the measuring resistor sets the value for the constant.

15. The electronic circuit according to claim 14, wherein determining the second measurement signal comprises determining the second measurement signal based on a current though the second source connection and a proportionality factor.

16. The electronic circuit according to claim 14,
wherein an offset voltage is connected in series to the measuring resistor, and
wherein the threshold value further depends on a value for the offset voltage.

17. The electronic circuit according to claim 16,
wherein a current through the first source connection is a measurement current, which depends on a current though the second source connection and a proportionality factor, and
wherein the error detection circuit includes a controller which is coupled to:
the drain-source voltage of the second electronic switch, and the first source connection.

18. The electronic circuit according to claim 17,
wherein the measuring resistor is connected in series to the controller,
wherein the second measurement signal comprises a voltage across the measuring resistor based on the measurement current.

19. The electronic circuit according to claim 14, wherein the error detection circuit includes an amplifier which is coupled to a load path of the first electronic switch, and which provides the first current measurement signal.

20. The electronic circuit according to claim 14,
wherein the first electronic switch comprises a low-side switch of an H-bridge and
wherein the second electronic switch comprises a high-side switch of the H-bridge.

21. The electronic circuit according to claim 14, the electronic circuit further comprising:
a control circuit which is configured to switch off at least one of the first electronic switch and the second electronic switch in response to the indication of the error by the error detection circuit.

22. The electronic circuit according to claim 14,
wherein the second electronic switch and the error detection circuit are part of a common integrated circuit, and
wherein the first electronic switch is arranged outside the integrated circuit.

23. The electronic circuit of claim 14, wherein the error detection circuit comprises an evaluation circuit that includes a comparator, wherein to compare the first measurement signal and the second measurement signal, the comparator is configured to receive the first measurement signal and the second measurement signal and output an indication of the error in response to the second measurement signal being different than the first measurement signal by more than the threshold value.

* * * * *